(12) United States Patent
You et al.

(10) Patent No.: US 8,659,021 B2
(45) Date of Patent: Feb. 25, 2014

(54) ORGANIC LIGHT-EMITTING DISPLAY DEVICE AND METHOD OF MANUFACTURING THE SAME

(75) Inventors: Chun-Gi You, Yongin (KR); Joon-Hoo Choi, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 365 days.

(21) Appl. No.: 13/205,846

(22) Filed: Aug. 9, 2011

(65) Prior Publication Data

US 2012/0146030 A1 Jun. 14, 2012

(30) Foreign Application Priority Data

Dec. 14, 2010 (KR) .................. 10-2010-0127857

(51) Int. Cl.
*H01L 29/786* (2006.01)

(52) U.S. Cl.
USPC .......... 257/59; 257/72; 257/83; 257/E29.273; 257/E33.064; 313/505

(58) Field of Classification Search
USPC ............... 257/59, 72, 83, E29.273, E33.064; 313/500, 505
See application file for complete search history.

(56) References Cited

U.S. PATENT DOCUMENTS

| | | | |
|---|---|---|---|
| 7,402,948 B2 | 7/2008 | Yamazaki et al. | |
| 7,423,374 B2 * | 9/2008 | Okano | 313/509 |
| 7,728,510 B2 * | 6/2010 | Oh | 313/504 |
| 7,812,523 B2 * | 10/2010 | Jung et al. | 313/506 |
| 8,030,838 B2 * | 10/2011 | Kwak et al. | 313/503 |
| 2009/0146557 A1 | 6/2009 | Shinto et al. | |

FOREIGN PATENT DOCUMENTS

| | | |
|---|---|---|
| JP | 2003-317971 | 11/2003 |
| JP | 2009-139678 | 6/2009 |
| KR | 10-2005-0105852 | 11/2005 |
| KR | 10-2007-0035884 | 4/2007 |

* cited by examiner

*Primary Examiner* — Minh-Loan T Tran

(74) *Attorney, Agent, or Firm* — Robert E. Bushnell, Esq.

(57) ABSTRACT

An organic light-emitting display device is manufactured via a simple process and has an improved aperture ratio. The organic light-emitting display device comprising: a substrate; an auxiliary electrode formed on the substrate; a thin film transistor (TFT) formed on the auxiliary electrode, the TFT comprising an active layer, a gate electrode, a source electrode and a drain electrode; an organic electroluminescent (EL) device electrically connected to the TFT and formed by sequentially stacking a pixel electrode formed on the same layer by using the same material as portions of the source and drain electrodes, an intermediate layer comprising an organic light emission layer (EML), and an opposite electrode disposed to face the pixel electrode; and a contact electrode formed on the same layer by a predetermined distance by using the same material as the source and drain electrodes, and electrically connecting the auxiliary electrode and the opposite electrode.

19 Claims, 6 Drawing Sheets

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 14 Dec. 2010 and there duly assigned Ser. No. 10-2010-0127857.

BACKGROUND OF THE INVENTION

1. Field of the Invention

The present invention relates to an organic light-emitting display device and a method of manufacturing the same, and more particularly, to an organic light-emitting display device having an improved aperture ratio and a method of manufacturing the organic light-emitting display device.

2. Description of the Related Art

A flat panel display device, including an organic light-emitting display device, a liquid crystal display (LCD) device or the like, is manufactured on a substrate whereon a pattern including a thin film transistor (TFT), a capacitor, and a line including the TFT and the capacitor is formed.

In general, in order to form a minute structure pattern, including the TFT or the like, on the substrate for manufacturing the flat panel display device, the pattern is transferred to the substrate by using a mask having a minute structure pattern.

A process of transferring a pattern by using a mask may generally use a photolithography process. In the photolithography process, a photoresist is uniformly applied onto a substrate whereon the pattern is to be formed, the photoresist is exposed (in the case of a positive photoresist) by using an exposing device including a stepper, and then the photosensitive photoresist is developed. After the photoresist is developed, the pattern is etched by using the remaining photoresist as a mask, and unnecessary photoresist is removed.

As described above, in the process of transferring the pattern by using the mask, it is necessary to first arrange a mask having a desired pattern, and thus manufacturing costs for preparing masks increase as the number of processes using the masks increases. Also, in the process, the aforementioned complicated operations have to be performed, which results in a complex manufacturing process, an increase in the manufacturing time, and an increase in the manufacturing costs.

SUMMARY OF THE INVENTION

The present invention provides an organic light-emitting display device manufactured via a simple process and having an improved aperture ratio, and a method of manufacturing the organic light-emitting display device.

According to an aspect of the present invention, there is provided an organic light-emitting display device comprising: a substrate; an auxiliary electrode formed on the substrate; a thin film transistor (TFT) formed on the auxiliary electrode, the TFT including an active layer, a gate electrode, a source electrode and a drain electrode; an organic electroluminescent (organic EL) device electrically connected to the TFT and formed by sequentially stacking a pixel electrode formed on the same layer by using the same material as portions of the source and drain electrodes, an intermediate layer comprising an organic light emission layer (EML), and an opposite electrode disposed to face the pixel electrode; and a contact electrode formed on the same layer by a predetermined distance by using the same material as the source and drain electrodes; and electrically connecting the auxiliary electrode and the opposite electrode.

A first insulating layer may be interposed between the auxiliary electrode and the active layer, a second insulating layer may be interposed between the active layer and the gate electrode, and an interlayer insulating layer may be interposed between the gate electrode and the contact electrode, and the contact electrode and the auxiliary electrode may contact each other via a contact hole penetrating the first insulating layer, the second insulating layer, and the interlayer insulating layer.

A pixel-defining layer (PDL) may be interposed between the contact electrode and the opposite electrode, and the contact electrode and the opposite electrode may contact each other via a contact hole penetrating the PDL.

An end of the contact electrode may directly contact the opposite electrode and the other end of the contact electrode may directly contact the auxiliary electrode.

One electrode of the source and drain electrodes may extend in one direction so as to form the pixel electrode.

The pixel electrode and one electrode of the source and drain electrodes may be integrally formed.

The organic light-emitting display device may be a top emission type organic light-emitting display device in which an image is realized toward the opposite electrode.

The opposite electrode may include at least one material selected from the group consisting of ITO, IZO, ZnO, and $In_2O_3$.

The auxiliary electrode may include at least one material selected from the group consisting of Ag, Mg, Al, Pt, Pd, Au, Ni, Nd, Ir, Cr, Li, Ca, Mo, Ti, W, MoW, and Al/Cu.

According to another aspect of the present invention, there is provided an organic light-emitting display device comprising: an auxiliary electrode formed on a substrate; a first insulating layer formed on the auxiliary electrode; an active layer formed on the first insulating layer; a second insulating layer formed to cover the active layer; a gate electrode formed on the second insulating layer so as to overlap the active layer; an interlayer insulating layer formed to cover the gate electrode; source and drain electrodes formed on the interlayer insulating layer so as to be electrically connected with the active layer; a contact electrode formed on the same layer by using the same material as the source and drain electrodes, and contacting a portion of the auxiliary electrode; a pixel-defining layer (PDL) formed to cover the contact electrode and the source and drain electrodes; and an opposite electrode formed on the PDL; wherein a portion of the opposite electrode contacts the contact electrode.

The pixel electrode and one electrode of the source and drain electrodes may be integrally formed.

The organic light-emitting display device may be a top emission type organic light-emitting display device in which an image is realized toward the opposite electrode.

The opposite electrode may include at least one material selected from the group consisting of ITO, IZO, ZnO, and $In_2O_3$.

The auxiliary electrode may include at least one material selected from the group consisting of Ag, Mg, Al, Pt, Pd, Au, Ni, Nd, Ir, Cr, Li, Ca, Mo, Ti, W, MoW, and Al/Cu.

According to another aspect of the present invention, there is provided a method of manufacturing an organic light-emitting display device, the method comprising the steps of: forming an auxiliary electrode on a substrate; performing a first mask process for forming an active layer on the auxiliary electrode; performing a second mask process for forming a gate electrode on the active layer; performing a third mask process for forming an interlayer insulating layer having an opening exposing both sides of the active layer and a portion of the auxiliary electrode; performing a fourth mask process for forming source and drain electrodes contacting the exposed both sides of the active layer, a pixel electrode extending in one direction from the source and drain electrodes, and a contact electrode contacting the exposed portion of the auxiliary electrode; performing a fifth mask process for forming a pixel-defining layer (PDL) exposing a portion of the pixel electrode and a portion of the contact electrode; and forming an opposite electrode on the PDL so as to contact the exposed portion of the contact electrode.

The third mask process includes the operations of depositing a third insulating layer on the gate electrode; and patterning the third insulating layer so as to form the opening exposing portions of the source and drain regions of the active layer and exposing the portion of the auxiliary electrode.

The fourth mask process includes the operations of depositing a fourth conductive layer and/or a fifth conductive layer on the interlayer insulating layer; and patterning the fourth conductive layer and/or the fifth conductive layer so as to form the source and drain electrodes, the pixel electrode, and the contact electrode.

The fifth mask process includes the operations of completely stacking a fourth insulating layer on the substrate, and patterning the fourth insulating layer so as to form an opening exposing portions of the contact electrode and the pixel electrode.

The organic light-emitting display device may be a top emission type organic light-emitting display device in which an image is realized toward the opposite electrode.

The opposite electrode may include at least one material selected from the group consisting of ITO, IZO, ZnO, and $In_2O_3$.

The auxiliary electrode may include at least one material selected from the group consisting of Ag, Mg, Al, Pt, Pd, Au, Ni, Nd, Ir, Cr, Li, Ca, Mo, Ti, W, MoW, and Al/Cu.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown. The invention may, however, be embodied in many different forms, and should not be construed as being limited to the embodiments set forth herein. Throughout the specification, a term "and/or" includes at least one from among all listed components and one or more combinations of all listed components.

Figure 1:
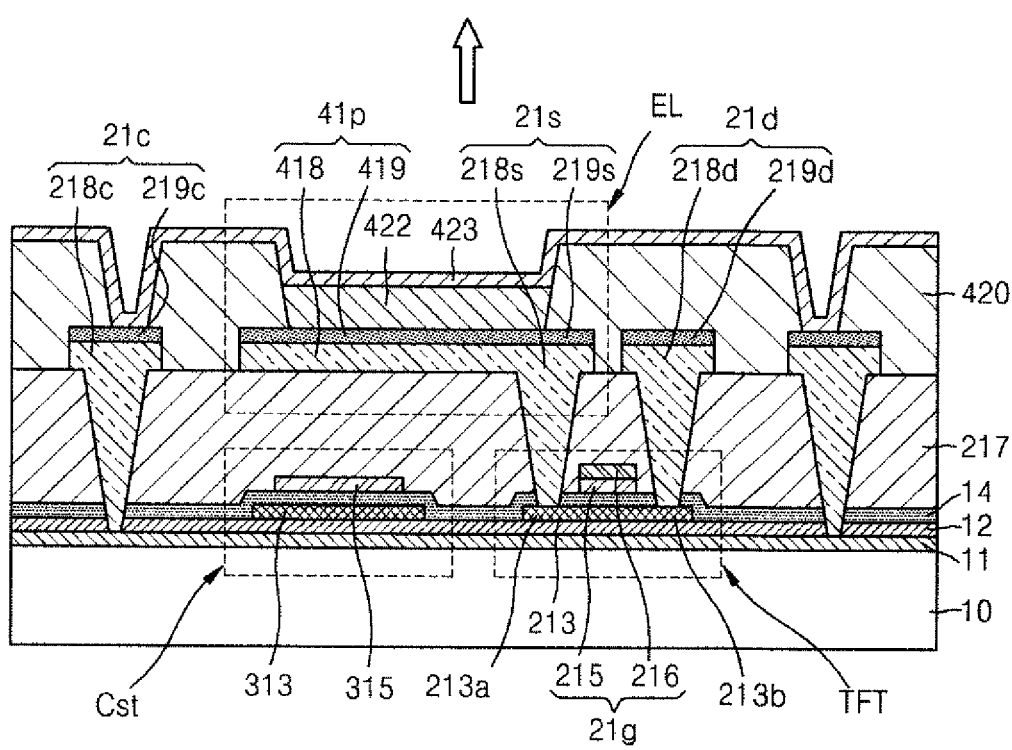
FIG. 1 is a cross-sectional view of an organic light-emitting display device according to an embodiment of the present invention.

FIG. 1 is a cross-sectional view of an organic light-emitting display device according to an embodiment of the present invention.

Referring to FIG. 1, the organic light-emitting display device includes a substrate 10, a thin film transistor (TFT), a storage capacitor Cst, and an organic electroluminescent (EL) device.

In more detail, an auxiliary electrode 11 is formed on the substrate 10, and a first insulating layer 12 including a buffer layer is formed on the auxiliary electrode 11. An active layer 213 of the TFT and a capacitor lower electrode 313 of the storage capacitor Cst, which are formed of the same material by patterning a semiconductor layer, are formed a predetermined distance from each other on the same layer on the first insulating layer 12.

A second insulating layer 14 is formed on the active layer 213 and the capacitor lower electrode 313. A gate electrode 21g of the TFT and a capacitor upper electrode 315 of the storage capacitor Cst, which are formed of the same material by patterning a second conductive layer and a third conductive layer, are formed a predetermined distance from each other on the same layer on the second insulating layer 14. The gate electrode 21g may include a gate lower electrode 215 and a gate upper electrode 216. Source and drain regions 213a and 213b, respectively, may be formed at side ends of the active layer 213, which correspond to both sides of the gate electrode 21g, and a channel region may be formed therebetween.

An interlayer insulating layer 217 is formed on the gate electrode 21g and the capacitor upper electrode 315. A source electrode 21s, a drain electrode 21d, and a contact electrode 21c, which are formed of the same material by patterning a fourth conductive layer and a fifth conductive layer, are formed a predetermined distance from each other on the same layer on the interlayer insulating layer 217. The source electrode 21s may include a source lower electrode 218s and a source upper electrode 219s, the drain electrode 21d may include a drain lower electrode 218d and a drain upper electrode 219d, and the contact electrode 21c may include a contact lower electrode 218c and a contact upper electrode 219c. A portion of the source electrode 21s may extend into a pixel region, and the extending portion may form a pixel electrode 41p. The pixel electrode 41p may include a pixel lower electrode 418 and a pixel upper electrode 419.

The source electrode 21s and the drain electrode 21d may be electrically connected to the source and drain regions 213a and 213b, respectively, at the side ends of the active layer 213 via a contact hole. Also, the contact electrode 21c may be electrically connected to the auxiliary electrode 11 via a contact hole.

A pixel-defining layer (PDL) 420 may be formed on the source electrode 21s, the drain electrode 21d, the contact electrode 21c, and the pixel electrode 41p so as to define a pixel region. An intermediate layer 422, including an organic light emission layer (EML), is formed on the pixel electrode 41p, and then an opposite electrode 423 is formed thereon. The opposite electrode 423 may be electrically connected to the contact electrode 21c via a contact hole.

As a result, the auxiliary electrode 11 and the opposite electrode 423 are electrically connected to each other via the contact electrode 21c. By using the present embodiment, it is possible to solve an IR drop problem which occurs due to a high resistance applied to the opposite electrode 423 in a top emission type organic light-emitting display device having an improved aperture ratio, as will now be described in detail in the following paragraphs.

The organic light-emitting display device may be classified into a top emission type organic light-emitting display device in which an image is realized away from the substrate 10 (that is, the image is realized toward the opposite electrode 423), or a bottom emission type organic light-emitting display device in which an image is realized toward the substrate 10. From among the aforementioned two types, the top emission type organic light-emitting display device is advantageous in that it has a further improved aperture ratio, compared to the bottom emission type organic light-emitting display device. However, in order that the image be realized toward the opposite electrode 423, the opposite electrode 423 has to be formed as a transparent electrode including ITO or the like, but the transparent electrode generally has a high resistance so that the IR drop problem is incurred due to the resistance.

Thus, in order to realize a top emission display device having a further improved aperture ratio and simultaneously decrease the high resistance of the opposite electrode 423, the organic light-emitting display device according to the present embodiment is characterized in that the auxiliary electrode 11 is disposed directly on the substrate 10, and the opposite electrode 423 and the auxiliary electrode 11 are electrically connected via the contact electrode 21c. By electrically connecting the opposite electrode 423, which is formed as the transparent electrode including ITO and has a high resistance, to the auxiliary electrode 11 formed of metal, the resistance applied to the opposite electrode 423 may be significantly decreased. According to the present embodiment, it is possible to realize the top emission type organic light-emitting display device having an improved aperture ratio and simultaneously decrease the resistance of the opposite electrode 423.

Hereinafter, a method of manufacturing the organic light-emitting display device of FIG. 1 will now be described in detail.

FIGS. 2 thru 11 are cross-sectional views illustrating processes of manufacturing the organic light-emitting display device of FIG. 1.

Figure 2:
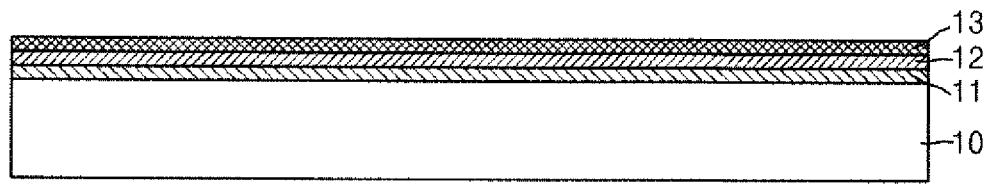
FIGS. 2 thru 11 are cross-sectional views illustrating processes of manufacturing the organic light-emitting display device of FIG. 1.

Referring to FIG. 2, first conductive layer 11, first insulating layer 12, and semiconductor layer 13 are sequentially formed on the substrate 10.

The substrate 10 may be formed of a transparent glass material containing $SiO_2$ as a main component, but is not limited thereto, and thus it may formed of one of various materials including a transparent plastic material, a metal material, or the like.

The first conductive layer 11, functioning as an auxiliary cathode electrode, is deposited on the substrate 10. The first conductive layer 11 may include one or more materials selected from the group consisting of Ag, Mg, Al, Pt, Pd, Au, Ni, Nd, Ir, Cr, Li, Ca, Mo, Ti, W, MoW, and Al/Cu. The organic light-emitting display device is characterized in that the first conductive layer 11, functioning as an auxiliary electrode, is formed directly on the substrate 10, and the opposite electrode 423 (refer to FIG. 1) and the first conductive layer 11 are electrically connected via the contact electrode 21c (refer to FIG. 1), so that a resistance applied to the opposite electrode 423 (refer to FIG. 1) is significantly decreased. Hereinafter, the first conductive layer 11 is referred to as "auxiliary electrode 11".

The first insulating layer 12, including a barrier layer and/or a buffer layer, may be arranged on the first conductive layer 11 so as to prevent diffusion of impurity ions, to prevent penetration of moisture or air, and to planarize a surface of the substrate 10. The first insulating layer 12 may be deposited by performing one of various deposition methods, including a plasma-enhanced chemical vapor deposition (PECVD) method, an atmospheric pressure chemical vapor deposition (APCVD) method, a low-pressure chemical vapor deposition (LPCVD) method, or the like, by using $SiO_2$ and/or $SiN_x$.

The semiconductor layer 13 is formed on the first insulating layer 12. In more detail, amorphous silicon is first deposited on the first insulating layer 12, and then the amorphous silicon is crystallized so that the semiconductor layer 13, including a polycrystalline silicon layer, is formed. The amorphous silicon may be crystallized by using one of various methods, including a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, or the like. The semiconductor layer 13 is patterned into the active layer 213 of the TFT and the capacitor lower electrode 313 of the storage capacitor Cst, which are to be described below.

Figure 3:
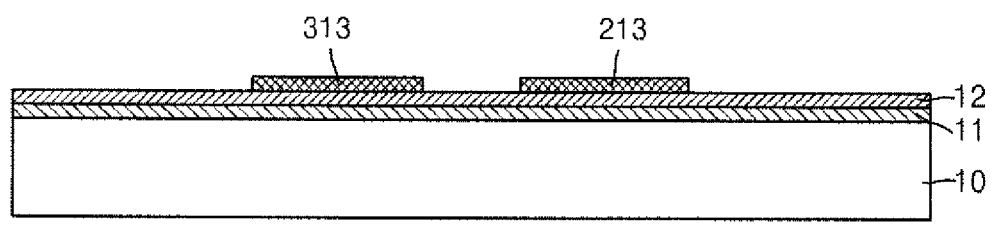

Next, as illustrated in FIG. 3, the semiconductor layer 13 of FIG. 2 is patterned to form the active layer 213 of the TFT and the capacitor lower electrode 313 of the storage capacitor Cst on the first insulating layer 12. In more detail, the semiconductor layer 13 is patterned into the active layer 213 of the TFT and the capacitor lower electrode 313 of the storage capacitor Cst via a mask process using a first mask (not shown). In the present embodiment, the active layer 213 and the capacitor lower electrode 313 are separate, but they may be integrally formed. In this manner, the active layer 213 of the TFT and the capacitor lower electrode 313 of the storage capacitor Cst may be formed on the same layer by using the same material.

Figure 4:
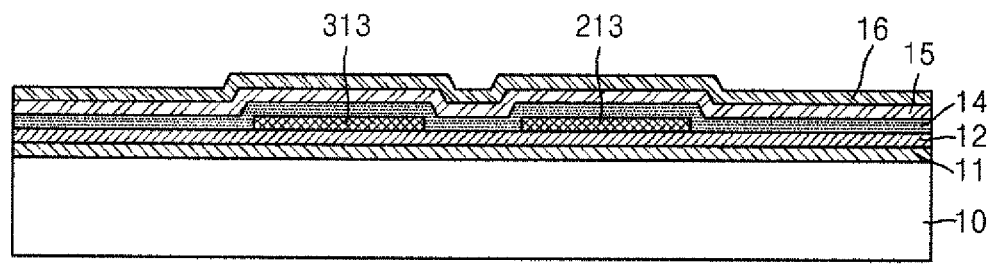

Next, as illustrated in FIG. 4, a second insulating layer 14, a second conductive layer 15, and a third conductive layer 16 are sequentially and completely deposited on the substrate 10 on which the active layer 213 and the capacitor lower electrode 313 were previously formed.

The second insulating layer 14 may be formed by depositing an inorganic insulating film including $SiN_x$ or $SiO_x$ by performing a PECVD method, an APCVD method, a LPCVD method, or the like. The second insulating layer 14 is interposed between the active layer 213 of the TFT and the gate electrode 21g (refer to FIG. 1) and functions as a gate insulating layer of the TFT, and is also interposed between the capacitor upper electrode 315 (refer to FIG. 1) and the capacitor lower electrode 313 and functions as a dielectric layer of the storage capacitor Cst.

The second conductive layer 15 may include one or more materials selected from the group consisting of Ag, Mg, Al, Pt, Pd, Au, Ni, Nd, Ir, Cr, Li, Ca, Mo, Ti, W, MoW, and Al/Cu. Also, the second conductive layer 15 may include one or more transparent materials selected from the group consisting of ITO, IZO, ZnO, and $In_2O_3$. Then, the second conductive layer 15 may be patterned into the gate lower electrode 215 and the capacitor upper electrode 315.

The third conductive layer 16 may include one or more materials selected from the group consisting of Ag, Mg, Al, Pt, Pd, Au, Ni, Nd, Ir, Cr, Li, Ca, Mo, Ti, W, MoW, and Al/Cu. Also, the third conductive layer 16 may include one or more transparent materials selected from the group consisting of ITO, IZO, ZnO, and $In_2O_3$. Then, the third conductive layer 16 may be patterned into a gate upper electrode 216.

Figure 5:
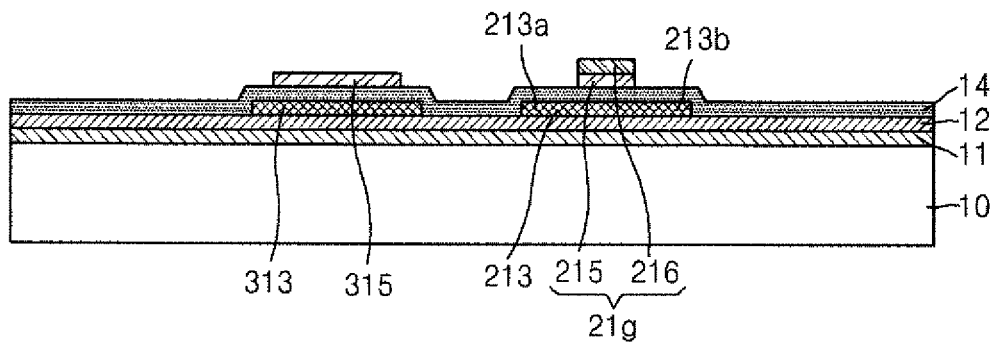

Next, as illustrated in FIG. 5, the gate electrode 21g and the capacitor upper electrode 315 are separately formed on the second insulating layer 14. In more detail, the second conductive layer 15 and the third conductive layer 16, which are sequentially and completely formed on the substrate 10, are patterned via a mask process using a second mask (not shown).

The gate electrode 21g is formed above the active layer 213. The gate electrode 21g includes the gate lower electrode 215 formed of a portion of the second conductive layer 15, and the gate upper electrode 216 formed of a portion of the third conductive layer 16

The gate electrode 21g is formed so as to correspond to a center of the active layer 213, and the active layer 213 is doped with an n-type impurity or a p-type impurity by using the gate electrode 21g as a mask, so that source and drain regions 213a and 213b, respectively, and a channel region therebetween may be formed at side ends of the active layer 213, which correspond to both sides of the gate electrode 21g.

The capacitor upper electrode 315 is patterned above the capacitor lower electrode 313. As illustrated in FIG. 5, the capacitor upper electrode 315 may be formed as a single layer of the second conductive layer 15. However, although not illustrated in drawings, the capacitor upper electrode 315 may be formed as a double-layer including portions of the second conductive layer 15 and the third conductive layer 16.

Figure 6:
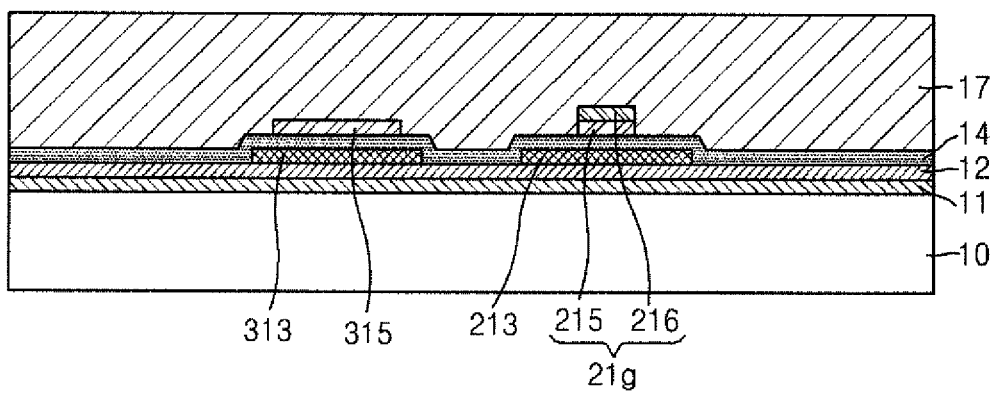

Next, as illustrated in FIG. 6, a third insulating layer 17 is completely deposited on the substrate 10 on which the gate electrode 21g and the capacitor upper electrode 315 are formed.

The third insulating layer 17 may be formed of at least one organic insulating material selected from the group consisting of polyimide, polyamide, an acryl resin, benzocyclobutene, and a phenol resin, by performing a spin coating method, or the like. The third insulating layer 17 may have a sufficient thickness, (e.g., may have a thickness greater than a thickness of the second insulating layer 14) so as to function as an interlayer insulating layer between the gate electrode 21g of the TFT and the source and drain electrodes 21s and 21d, respectively (refer to FIG. 1). The third insulating layer 17 may be formed of not only the organic insulating material but also of an inorganic insulating material including the second insulating layer 14, or it may be formed alternately of the organic insulating material and the inorganic insulating material.

Figure 7:
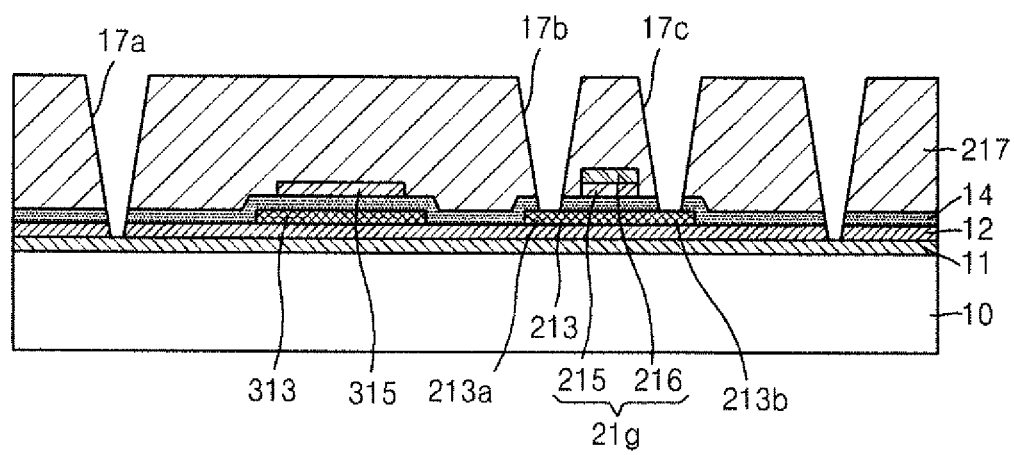

Next, as illustrated in FIG. 7, the third insulating layer 17 is patterned to form the interlayer insulating layer 217 having openings 17a, 17b, and 17c exposing portions of the auxiliary electrode 11 and the source and drain regions 213a and 213b, respectively.

In more detail, the third insulating layer 17 is patterned via a mask process using a third mask (not shown), so that the third insulating layer 17 is formed having the openings 17a, 17b, and 17c. The openings 17b and 17c expose portions of the source and drain regions 213a and 213b, respectively, and the opening 17a exposes the portion of the auxiliary electrode 11.

Figure 8:
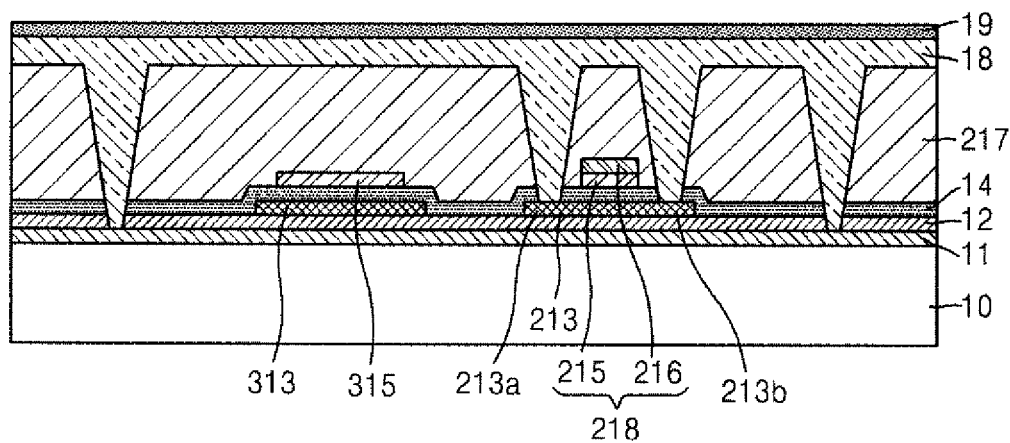

Next, as illustrated in FIG. 8, a fourth conductive layer 18 and a fifth conductive layer 19 are completely deposited on the substrate 10 so as to cover the interlayer insulating layer 217. The fourth conductive layer 18 and the fifth conductive layer 19 may be formed of the same conductive material as the second conductive layer 15 or the third conductive layer 16 but are not limited thereto, and thus they may be formed of various conductive materials. The conductive material may be deposited to a thickness sufficient to fill the openings 17a, 17b, and 17c. That is, the fourth conductive layer 18 and the fifth conductive layer 19 may contact the auxiliary electrode 11 via the opening 17a.

Figure 9:
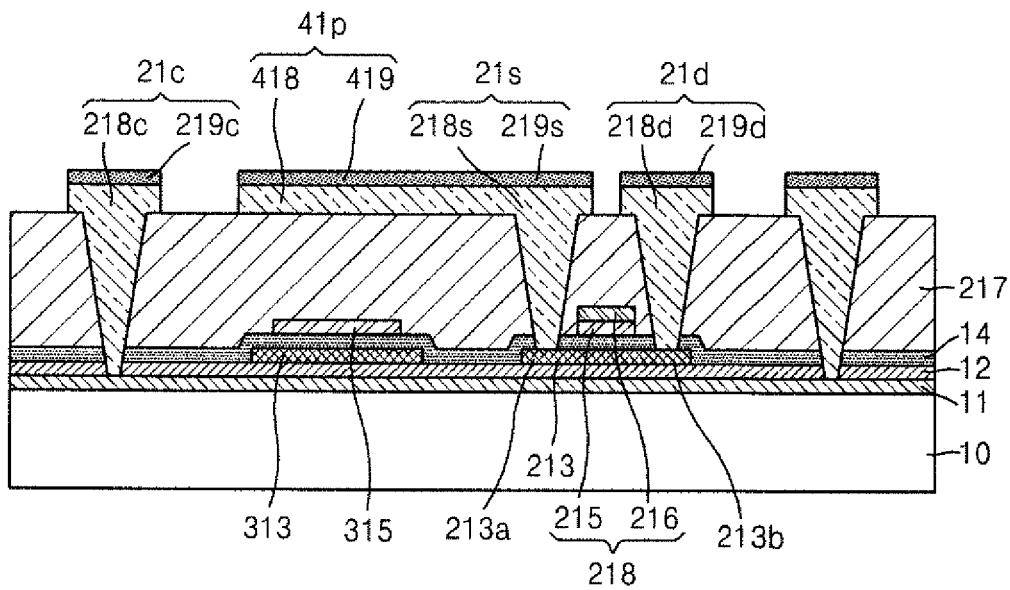

Next, as illustrated in FIG. 9, each of the fourth conductive layer 18 and the fifth conductive layer 19 is patterned to form the source electrode 21s, the drain electrode 21d, the contact electrode 21c, and the pixel electrode 41p.

In more detail, each of the fourth conductive layer 18 and the fifth conductive layer 19 is patterned via a mask process using a fourth mask (not shown), so that each of the fourth conductive layer 18 and the fifth conductive layer 19 forms the source electrode 21s, the drain electrode 21d, and the contact electrode 21c. Thus, the source electrode 21s, the drain electrode 21d, and the contact electrode 21c are formed on the same layer by using the same material. An end of the contact electrode 21c contacts the auxiliary electrode 11.

An end of the source electrode 21s or the drain electrode 21d may extend toward a region in which the organic EL device (refer to FIG. 1) is formed (in the present embodiment, the source electrode 21s extends toward the region in question), and the extending portion may form the pixel electrode 41p. The pixel electrode 41p may include the pixel lower electrode 418 and the pixel upper electrode 419.

Figure 10:
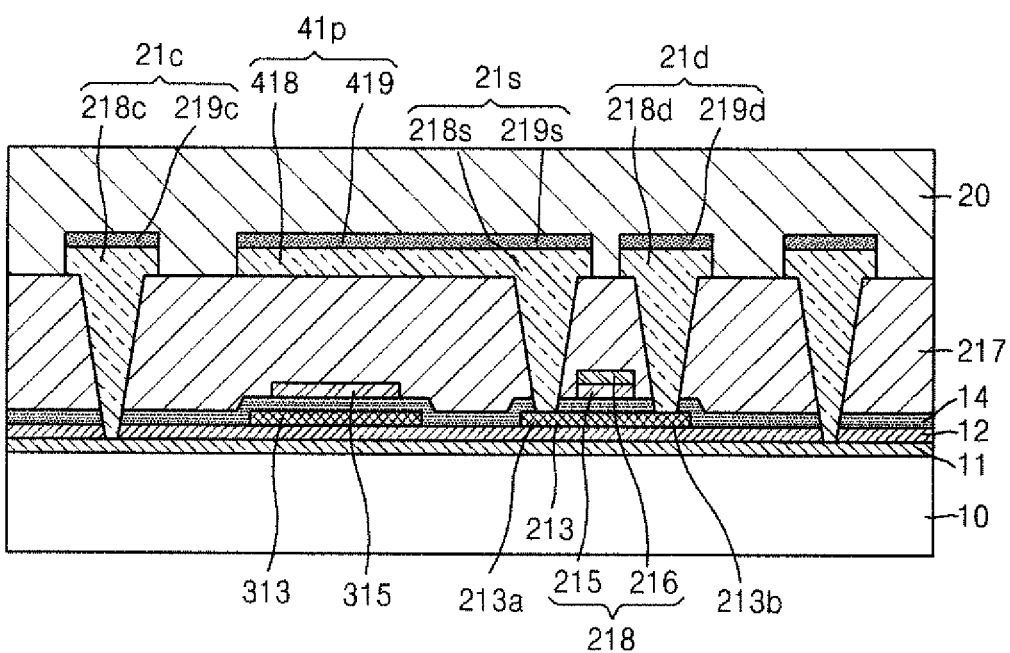
Figure 11:
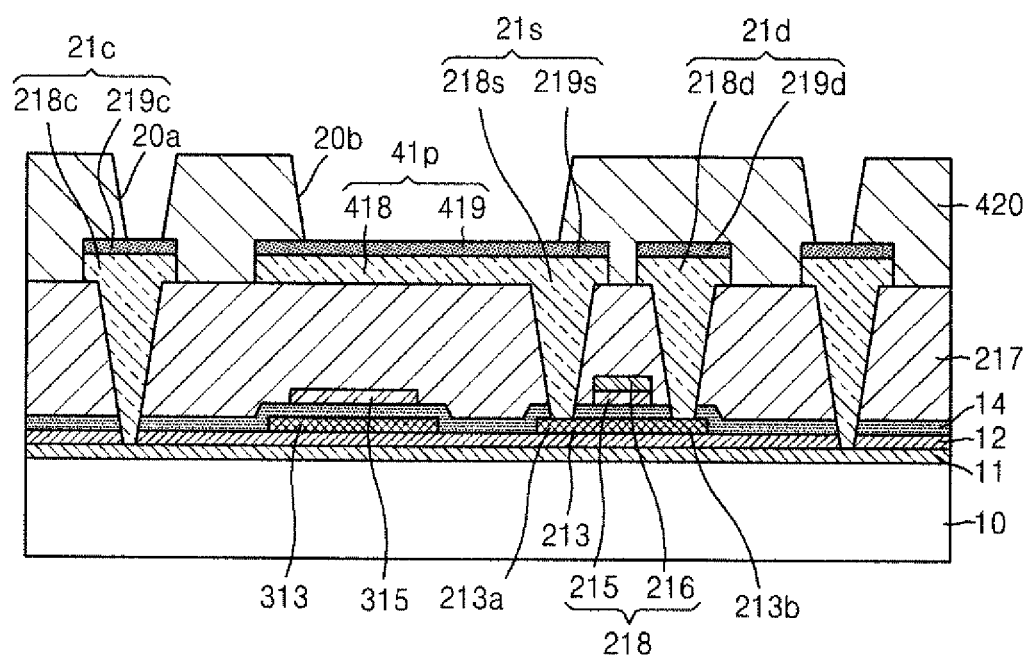

Next, as illustrated in FIGS. 10 and 11, the PDL 420 of FIG. 11 is formed on the substrate 10.

In more detail, as illustrated in FIG. 10, a fourth insulating layer 20 is completely deposited on the substrate 10 on which the source electrode 21s, the drain electrode 21d, the contact electrode 21c, and the pixel electrode 41p are formed. The fourth insulating layer 20 may be formed of at least one organic insulating material selected from the group consisting of polyimide, polyamide, an acryl resin, benzocyclobutene, and a phenol resin, by performing a spin coating method, or the like. Also, the fourth insulating layer 20 may be formed of not only the organic insulating material but also of an inorganic insulating material selected from the group consisting of $SiO_2$, $SiN_x$, $Al_2O_3$, $CuOx$, $Tb_4O_7$, $Y_2O_3$, $Nb_2O_5$, and $Pr_2O_3$. Also, the fourth insulating layer 20 may be formed to have a multi-layer structure of alternate organic insulating material and inorganic insulating material.

As illustrated in FIG. 11, the fourth insulating layer 20 is patterned to form the PDL 420 having openings 20a and 20b exposing portions of the contact electrode 21c and the pixel electrode 41p, respectively.

In more detail, the fourth insulating layer 20 is patterned via a mask process using a fifth mask (not shown) so as to form the PDL 420 which defines a pixel by forming the opening 20b exposing a center portion of the pixel electrode 41p. Simultaneously, the opening 20a exposing a center portion of the contact electrode 21c is formed.

The PDL 420 has a predetermined thickness so as to widen a gap between side ends of the pixel electrode 41p and the opposite electrode 423 (refer to FIG. 1), and to prevent electric field concentration on the side ends of the pixel electrode 41p, so that the PDL 420 prevents a short circuit between the pixel electrode 41p and the opposite electrode 423 (refer to FIG. 1).

Afterward, the intermediate layer 422, including an EML, is formed on the opening 20b exposing the pixel electrode 41p, and then the opposite electrode 423 is formed on the opening 20b exposing the pixel electrode 41p and is formed on the opening 20a exposing the contact electrode 21c, so that the organic light-emitting display device according to the embodiment of FIG. 1 is completely manufactured.

In more detail, the intermediate layer 422 may have a single-layer or multiple-layer structure in which the EML, a hole transport layer (HTL), a hole injection layer (HIL), an electron transport layer (ETL), and an electron injection layer (EIL) are stacked.

The intermediate layer 422 may be formed of a low-molecular weight organic material or a polymer organic material.

When formed of a low-molecular weight organic material, the intermediate layer 422 may be formed by stacking the HTL and the HIL from the EML toward the pixel electrode 41p, and by stacking the ETL and the EIL toward the opposite electrode 423. If necessary, various layers other than the aforementioned layers may be stacked. Examples of the low-molecular weight organic material include copper phthalocyanine (CuPc), N,N'-Di(naphthalene-1-yl)-N,N'-diphenyl-benzidine (NPB), tris-8-hydroxyquinoline aluminum (Alq3), etc.

When formed of a polymer organic material, the intermediate layer 422 may have a structure in which the EML and the HTL are sequentially stacked on the intermediate layer 422 toward the pixel electrode 41p. The HTL may be formed on the pixel electrode 41p by using poly(3,4-ethylenedioxythiophene) (PEDOT) or polyaniline (PANI) and by performing an inkjet printing method or a spin coating method. The low-molecular weight polymer organic material may include poly-(p-phenylene vinylene) (PPV) and polyfluorene, and a color pattern may be formed by using one of the general methods including an inkjet printing method, a spin coating method, or a thermal transfer method using a laser.

The opposite electrode 423 may be completely deposited on the substrate 10 as a common electrode. In the organic light-emitting display device according to the embodiment of FIG. 1, the pixel electrode 41p is used as an anode electrode and the opposite electrode 423 is used as a cathode electrode. However, the polarities of the pixel electrode 41p and the opposite electrode 423 may be switched.

In a case where the organic light-emitting display device is a top emission type organic light-emitting display device in which an image is realized away from the substrate 10 (that is, the image is realized toward the opposite electrode 423), the opposite electrode 423 is formed as a transparent electrode and the pixel electrode 41p is formed as a reflective electrode. The reflective electrode may be formed by thinly depositing metal having a low work function, and the metal includes Ag, Mg, Al, Pt, Pd, Au, Ni, Nd, Ir, Cr, Li, Ca, LiF/Ca, LiF/Al or compound of any of these.

In the aforementioned mask processes performed to manufacture the organic light-emitting display device, a laminated film may be removed by performing dry etching or wet etching.

As described above, the opposite electrode 423, which is formed of a transparent electrode including ITO and has a high resistance, is electrically connected to the auxiliary electrode 11 formed of metal, so that a resistance applied to the opposite electrode 423 may be significantly decreased. Thus, it is possible to realize a top emission display device having further improved aperture ratio and to simultaneously decrease the high resistance of the opposite electrode 423.

Although the organic light-emitting display device is described in the one or more embodiments of the present invention, the one or more embodiments are not limited thereto and may include various display devices, including a liquid crystal display (LCD) device.

Also, although one TFT and one capacitor are illustrated in the accompanying drawings related to the one or more embodiments, this is only for convenience of description, and it is obvious that a plurality of TFTs and a plurality of capacitors may be included as long as the number of mask processes in the one or more embodiments is not increased.

According to the one or more embodiments of the present invention, the manufacturing method of the organic light-emitting display device is simplified, and an aperture ratio of the organic light-emitting display device is improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
   a substrate;
   an auxiliary electrode formed on the substrate;
   a thin film transistor (TFT) formed on the auxiliary electrode, the TFT comprising an active layer, a gate electrode, a source electrode and a drain electrode;
   an organic electroluminescent (EL) device electrically connected to the TFT and formed by sequentially stacking a pixel electrode formed on a same layer by using a same material as portions of the source and drain electrodes, an intermediate layer comprising an organic light emission layer (EML), and an opposite electrode disposed to face the pixel electrode; and
   a contact electrode formed at a predetermined distance on the same layer by using the same material as the source and drain electrodes, and electrically connecting the auxiliary electrode and the opposite electrode.

2. The organic light-emitting display device of claim 1, further comprising a first insulating layer interposed between the auxiliary electrode and the active layer, a second insulating layer interposed between the active layer and the gate electrode, and an interlayer insulating layer interposed between the gate electrode and the contact electrode;
   wherein the contact electrode and the auxiliary electrode contact each other via a contact hole penetrating the first insulating layer, the second insulating layer and the interlayer insulating layer.

3. The organic light-emitting display device of claim 1, further comprising a pixel-defining layer (PDL) interposed between the contact electrode and the opposite electrode, wherein the contact electrode and the opposite electrode contact each other via a contact hole penetrating the PDL.

4. The organic light-emitting display device of claim 1, wherein an end of the contact electrode directly contacts the opposite electrode, and the other end of the contact electrode directly contacts the auxiliary electrode.

5. The organic light-emitting display device of claim 1, wherein one electrode of the source and drain electrodes extends in one direction so as to form the pixel electrode.

6. The organic light-emitting display device of claim 1, wherein the pixel electrode and one electrode of the source and drain electrodes are integrally formed.

7. The organic light-emitting display device of claim 1, wherein the organic light-emitting display device is a top emission type organic light-emitting display device in which an image is realized toward the opposite electrode.

8. The organic light-emitting display device of claim 7, wherein the opposite electrode comprises at least one material selected from a group consisting of ITO, IZO, ZnO, and $In_2O_3$.

9. The organic light-emitting display device of claim 7, wherein the auxiliary electrode comprises at least one material selected from a group consisting of Ag, Mg, Al, Pt, Pd, Au, Ni, Nd, Ir, Cr, Li, Ca, Mo, Ti, W, MoW, and Al/Cu.

10. An organic light-emitting display device, comprising:
    an auxiliary electrode formed on a substrate;
    a first insulating layer formed on the auxiliary electrode;
    an active layer formed on the first insulating layer;
    a second insulating layer formed so as to cover the active layer;
    a gate electrode formed on the second insulating layer so as to overlap the active layer;

an interlayer insulating layer formed so as to cover the gate electrode;

source and drain electrodes formed on the interlayer insulating layer so as to be electrically connected to the active layer;

a contact electrode formed on the same layer by using a same material as the source and drain electrodes, and contacting a portion of the auxiliary electrode;

a pixel-defining layer (PDL) formed so as to cover the contact electrode and the source and drain electrodes; and an opposite electrode formed on the PDL, wherein a portion of the opposite electrode contacts the contact electrode.

11. The organic light-emitting display device of claim 10, wherein the organic light-emitting display device is a top emission type organic light-emitting display device in which an image is realized toward the opposite electrode.

12. The organic light-emitting display device of claim 11, wherein the opposite electrode comprises at least one material selected from a group consisting of ITO, IZO, ZnO, and $In_2O_3$.

13. The organic light-emitting display device of claim 11, wherein the auxiliary electrode comprises at least one material selected from a group consisting of Ag, Mg, Al, Pt, Pd, Au, Ni, Nd, Ir, Cr, Li, Ca, Mo, Ti, W, MoW, and Al/Cu.

14. A method of manufacturing an organic light-emitting display device, the method comprising the steps of:

forming an auxiliary electrode on a substrate;

performing a first mask process for forming an active layer on the auxiliary electrode;

performing a second mask process for forming a gate electrode on the active layer;

performing a third mask process for forming an interlayer insulating layer having an opening exposing both sides of the active layer and a portion of the auxiliary electrode;

performing a fourth mask process for forming source and drain electrodes contacting the exposed both sides of the active layer, a pixel electrode extending in one direction from the source and drain electrodes, and a contact electrode contacting the exposed portion of the auxiliary electrode;

performing a fifth mask process for forming a pixel-defining layer (PDL) exposing a portion of the pixel electrode and a portion of the contact electrode; and forming an opposite electrode on the PDL so as to contact the exposed portion of the contact electrode.

15. The method of claim 14, wherein the third mask process comprises:

depositing a third insulating layer on the gate electrode; and patterning the third insulating layer so as to form an opening exposing portions of the source and drain regions of the active layer and the opening exposing the portion of the auxiliary electrode.

16. The method of claim 14, wherein the fourth mask process comprises:

depositing at least one of a fourth conductive layer and/or a fifth conductive layer on the interlayer insulating layer; and patterning said at least one of the fourth conductive layer and the fifth conductive layer so as to form the source and drain electrodes, the pixel electrode, and the contact electrode.

17. The method of claim 14, wherein the fifth mask process comprises:

completely stacking a fourth insulating layer on the substrate; and patterning the fourth insulating layer so as to form an opening exposing portions of the contact electrode and the pixel electrode.

18. The method of claim 14, wherein the opposite electrode comprises at least one material selected from a group consisting of ITO, IZO, ZnO, and $In_2O_3$.

19. The method of claim 14, wherein the auxiliary electrode comprises at least one material selected from a group consisting of Ag, Mg, Al, Pt, Pd, Au, Ni, Nd, Ir, Cr, Li, Ca, Mo, Ti, W, MoW, and Al/Cu.

* * * * *